(12) United States Patent
Lou et al.

(10) Patent No.: US 9,739,830 B2
(45) Date of Patent: Aug. 22, 2017

(54) TEST ASSEMBLY

(71) Applicant: STAr TECHNOLOGIES, INC., Hsinchu (TW)

(72) Inventors: Choon Leong Lou, Hsinchu (TW); Hsiao Ting Tseng, Hsinchu (TW); Ho Yeh Chen, Hsinchu (TW); Li Min Wang, Hsinchu (TW)

(73) Assignee: STAr TECHNOLOGIES, INC., Hsinchu (TW)

( * ) Notice: Subject to any disclaimer, the term of this patent is extended or adjusted under 35 U.S.C. 154(b) by 130 days.

(21) Appl. No.: 14/275,783

(22) Filed: May 12, 2014

(65) Prior Publication Data
US 2014/0340105 A1    Nov. 20, 2014

(30) Foreign Application Priority Data

May 15, 2013 (TW) .............................. 102209078 U (51) Int. Cl.
| | | |
|---|---|---|
| *G01R 1/04* | (2006.01) | |
| *G01R 31/28* | (2006.01) | |
| *G01R 1/073* | (2006.01) | |

(52) U.S. Cl.
CPC ..... *G01R 31/2889* (2013.01); *G01R 1/07342* (2013.01)

(58) Field of Classification Search
CPC ....................................................... G01R 1/04
(Continued)

(56) References Cited

U.S. PATENT DOCUMENTS 6,917,102 B2 * 7/2005 Zhou .................. G01R 1/07378
                                                                257/690
7,009,412 B2 * 3/2006 Chong ............... G01R 1/07342
                                                                324/754.14
(Continued)

FOREIGN PATENT DOCUMENTS

KR    10-2007-0053696    5/2007
KR    10-2008-0082670    9/2008

*Primary Examiner* — Son Le
*Assistant Examiner* — Akm Zakaria
(74) *Attorney, Agent, or Firm* — Liu & Liu (57) ABSTRACT

A test assembly adapted to test a semiconductor device is provided. The test assembly includes a main circuit board, an intermediate dielectric board, an intermediate circuit board, a plurality of intermediate conductive elements and a plurality of test probes. The main circuit board includes a surface and a plurality of pads disposed on the surface. The intermediate dielectric board is detachably disposed on the surface of the main circuit board and includes a plurality of through holes. The intermediate circuit board is disposed on the intermediated dielectric board and includes a plurality of first pads, a plurality of second pads, a first surface and a second surface opposite to the first surface. The intermediate conductive elements are disposed in the through holes, respectively. Each of the intermediate conductive elements electrically connects one of the pads of the main circuit board and one of the first pads of the intermediate circuit board. The test probes are disposed on the second surface of the intermediate circuit board and respectively electrically connected to the second pads of the intermediate circuit board. Each of the test probes is electrically connected to the main circuit board through the intermediate circuit board and one of the intermediated conductive elements.

18 Claims, 6 Drawing Sheets

(58) Field of Classification Search
USPC .................................................. 324/755, 756
See application file for complete search history.

(56) References Cited

U.S. PATENT DOCUMENTS

| | | |
|---|---|---|
| 2006/0006889 A1 | 1/2006 | Smith et al. |
| 2007/0046304 A1* | 3/2007 | Mok .................. G01R 1/07342 324/750.05 |
| 2008/0100291 A1* | 5/2008 | Mayder ................ H05K 3/4617 324/254 |
| 2010/0052707 A1 | 3/2010 | Nakayama et al. |
| 2010/0237889 A1* | 9/2010 | Desta ................. G01R 1/07378 324/756.05 |
| 2014/0077833 A1* | 3/2014 | Lee ...................... G01R 1/0491 324/756.03 |

* cited by examiner

TEST ASSEMBLY

CROSS REFERENCE TO RELATED APPLICATIONS

This application is based on and claims the benefit of priority from Taiwan Patent Application 102209078 filed on May 15, 2013, which is incorporated herein by reference and assigned to the assignee herein.

FIELD OF THE INVENTION

The present invention is related to a test assembly and in particular, to a test assembly used to test a semiconductor device.

DESCRIPTION OF THE PRIOR ART

Figure 1:
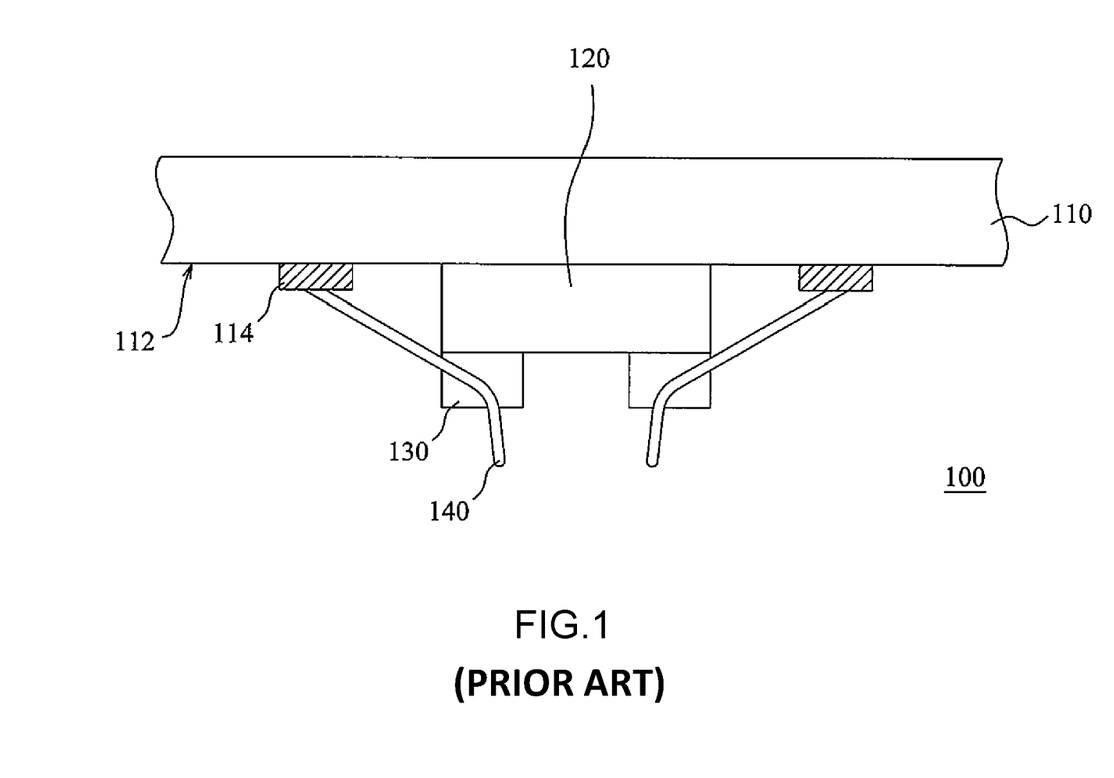
FIG. 1 is a schematic view of a conventional test assembly.

FIG. 1 is a schematic view of a conventional test assembly. Referring to FIG. 1, the conventional test assembly 100 is adapted to test a semiconductor device, such as a wafer (not shown). The test assembly 100 comprises a main circuit board 110, a probe base 120, a fixing element 130, and a plurality of cantilever probes 140. The main circuit board 110 comprises a surface 112 and a plurality of pads 114. The pads 114 are disposed on the surface 112. The main circuit board 110 can be connected to an external testing machine (not shown).

The probe base 120 is disposed on the surface 112 of the main circuit board 110. The fixing element 130 is made of glue and disposed on the probe base 120. The fixing element 130 is used to fix the cantilever probes 140. One end of each of the cantilever probes 140 is electrically connected to one of the pads 114 of the main circuit board 110 by means of soldering. The other end of each of the cantilever probes 140 is used to electrically contact a semiconductor device so as to test the semiconductor device. Specifically speaking, the main circuit board 110 receives test signals from the testing machine. The test signals are transmitted through the cantilever probes 140 such that an electrical test is performed on the semiconductor device.

However, circuit design of the main circuit board 110 becomes more intricate in order to meet functional requirements. In addition, only the main circuit board 110 serves as a medium of electrical connection between the testing machine and the cantilever probes 140. Accordingly, the main circuit board 110 has to be increasingly bulky. Therefore, the required spaced occupied by the main circuit board 110 of the conventional test assembly 100 is increased. Furthermore, when the circuit of the main circuit board 110 is defective and thus the main circuit board 110 must be replaced, the cost of replacing the main circuit board 110 having the intricate circuit is high. Moreover, as an end of each of the cantilever probes 140 is electrically connected to the main circuit board 110 by means of soldering, additional manufacturing expenses and time will have to be spent on re-soldering the cantilever probes 140 to a new main circuit board whenever the main circuit board 110 of which the circuit is defective must be replaced.

SUMMARY OF THE INVENTION

The present invention provides a test assembly of which the volume of the main circuit board is decreased and the main circuit board is easy to be replaced.

The present invention provides a test assembly adapted to test a semiconductor device. The test assembly includes a main circuit board, an intermediate dielectric board, an intermediate circuit board, a plurality of intermediate conductive elements and a plurality of test probes. The main circuit board includes a surface and a plurality of pads disposed on the surface. The intermediate dielectric board is detachably disposed on the surface of the main circuit board and includes a plurality of through holes. The intermediate circuit board is disposed on the intermediated dielectric board and includes a plurality of first pads, a plurality of second pads, a first surface and a second surface opposite to the first surface. The intermediate dielectric board is disposed between the intermediate circuit board and the main circuit board. The first pads are disposed on the first surface, the second pads are disposed on the second surface, and the first surface faces the intermediate dielectric board The intermediate conductive elements are disposed at the through holes, respectively. Each of the intermediate conductive elements electrically connects one of the pads of the main circuit board and one of the first pads of the intermediate circuit board. The test probes are disposed on the second surface of the intermediate circuit board and respectively electrically connected to the second pads of the intermediate circuit board. Each of the test probes is electrically connected to the main circuit board through the intermediate circuit board and one of the intermediated conductive elements.

In an embodiment of the present invention, the intermediate circuit board is detachably disposed on the intermediate dielectric board.

In an embodiment of the present invention, the intermediate conductive elements are detachably disposed at the through holes, respectively.

In an embodiment of the present invention, the test assembly further comprises a bottom cover, a plurality of first fixing elements and a plurality of second fixing elements. The bottom cover comprises a through opening. The intermediate circuit board and the intermediate dielectric board are detachably fixed to the bottom cover by means of the first fixing elements. The bottom cover is detachably fixed to the main circuit board by means of the second fixing elements. The test probes are corresponding to the through opening.

In an embodiment of the present invention, the test assembly further comprises a probe base disposed on the second surface of the intermediate circuit board and corresponding to the through opening. The test probes are supported by the probe base.

In an embodiment of the present invention, the intermediate dielectric board, the intermediate conductive elements, the intermediate circuit board, the bottom cover and the test probes are put together to form a sub-assembly in advance. The sub-assembly is detachably disposed on the main circuit board.

In an embodiment of the present invention, each of the intermediate conductive elements is a pogo pin.

In an embodiment of the present invention, each of the test probes is a cantilever probe.

In an embodiment of the present invention, the test assembly further comprises a main stiffener disposed on another surface of the main circuit board opposite to the surface.

The test assembly of the embodiment of the present invention comprises the main circuit board and the intermediate circuit board, and the intermediate conductive elements and the intermediate circuit board can serve the medium of electrical connection between the main circuit board and the test probes, so compared to the prior art, the circuit design of the main circuit board can be simplified such that the volume of the main circuit board can be reduced. Therefore, the required space occupied by the main circuit board of the test assembly of the embodiment of the present invention can decrease. Furthermore, if the circuit of the main circuit board is defective and thus the main circuit board must be replaced, the cost of replacing the main circuit board having the simple circuit is relatively low.

In addition, because each of the intermediate conductive elements can be a pogo pin and the sub-assembly formed from the intermediate dielectric board, the intermediate conductive elements, the intermediate circuit board, the bottom cover and the test probes in advance is detachably disposed on the main circuit board, the detachment of the sub-assembly from the main circuit board is easy whenever the main circuit board of which the circuit is defective must be replaced.

The following description, the appended claims, and the embodiments of the present invention further illustrate the features and advantages of the present invention.

DETAILED DESCRIPTION OF THE EMBODIMENTS

Figure 2:
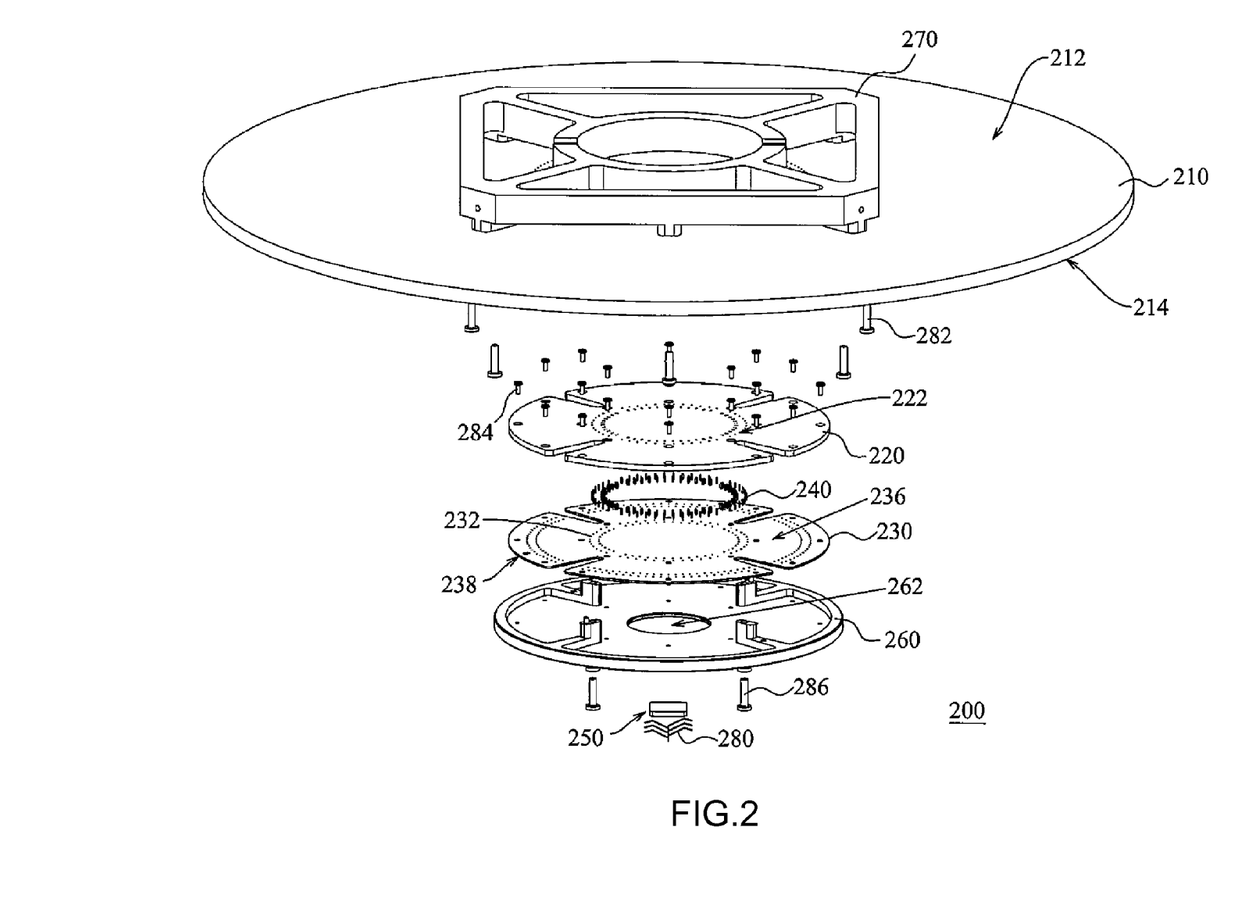
FIG. 2 is a schematic exploded view of a test assembly according to an embodiment of the present invention.
Figure 3A:
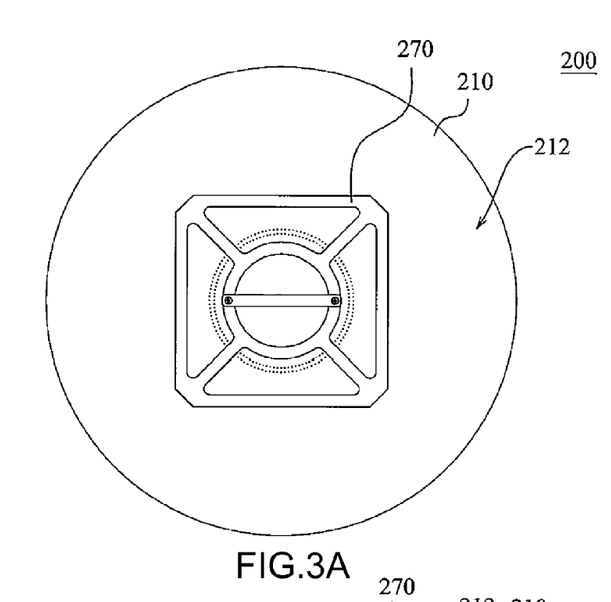
FIG. 3A is a schematic top view of the test assembly of FIG. 2 after assembled.
Figure 3B:
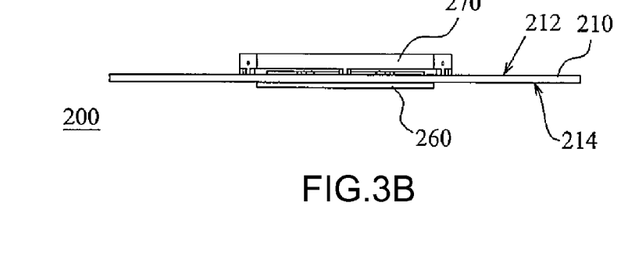
FIG. 3B is a schematic side view of the test assembly of FIG. 2 after assembled.
Figure 3C:
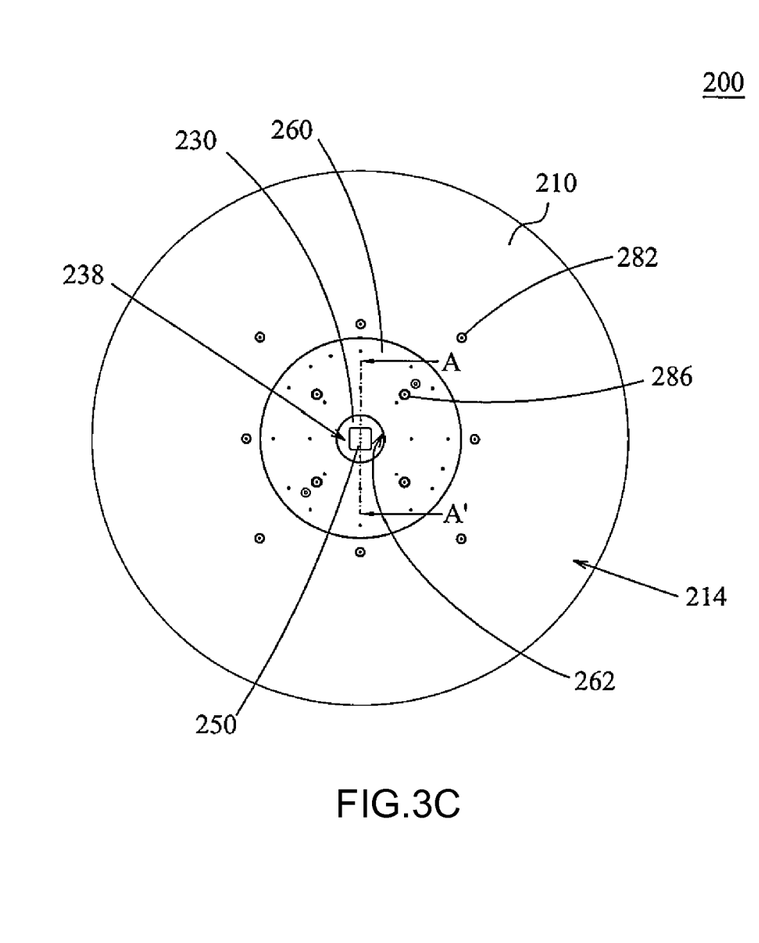
FIG. 3C is a schematic bottom view of the test assembly of FIG. 2 after assembled.
Figure 3D:
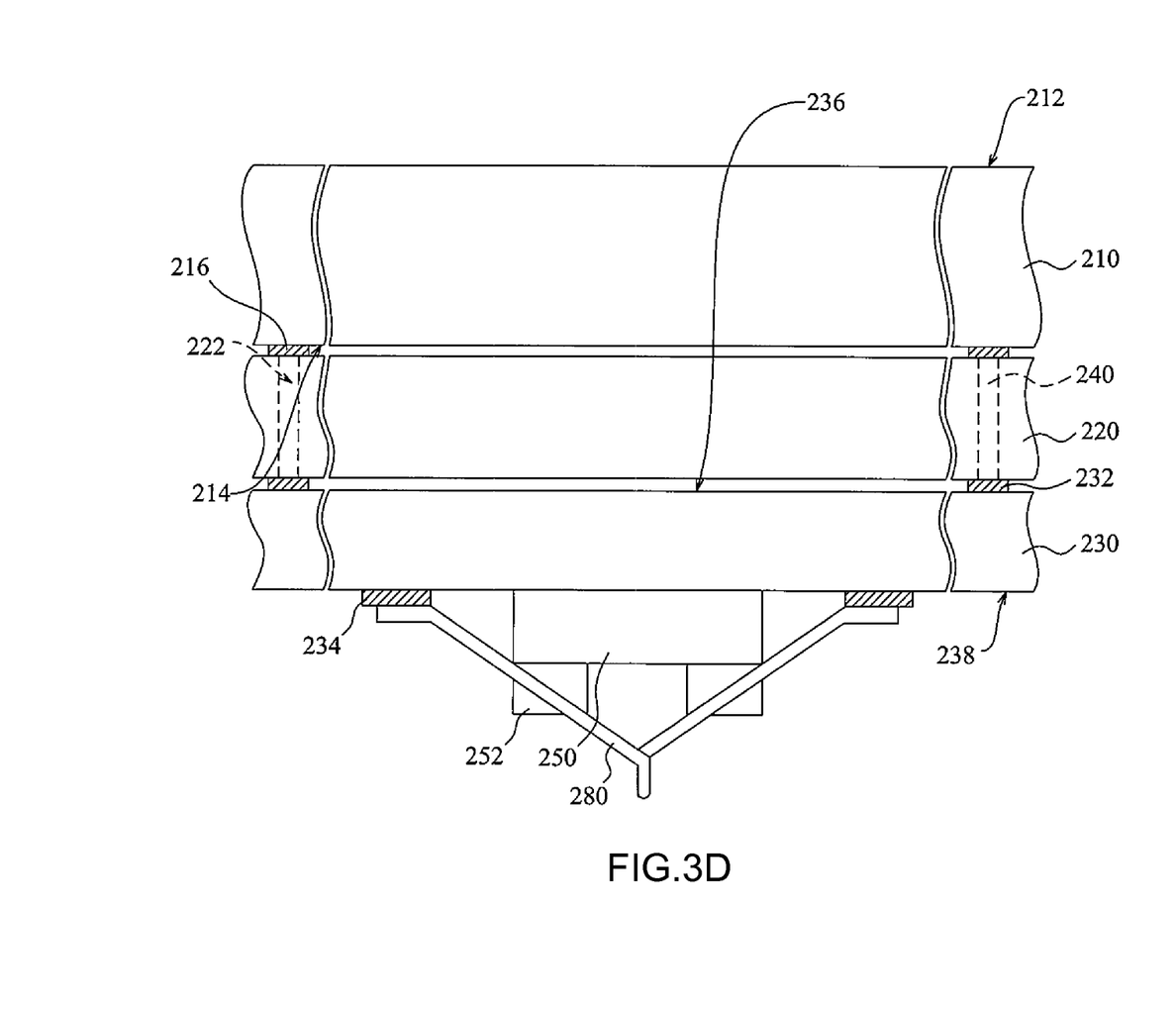
FIG. 3D is a schematic cross-sectional view of partial elements of the assembled test assembly taken along line AA' of FIG. 3C.

FIG. 2 is a schematic exploded view of a test assembly according to an embodiment of the present invention. FIG. 3A is a schematic top view of the test assembly of FIG. 2 after assembled. FIG. 3B is a schematic side view of the test assembly of FIG. 2 after assembled. FIG. 3C is a schematic bottom view of the test assembly of FIG. 2 after assembled. FIG. 3D is a schematic cross-sectional view of partial elements of the assembled test assembly taken along line AA' of FIG. 3C. For illustrative sake, a bottom cover and a main stiffener are omitted in FIG. 3D. Referring to FIG. 2 and FIG. 3A through FIG. 3D, in this embodiment, a test assembly 200 is adapted to test a semiconductor device, such as a wafer (not shown). The test assembly 200 comprises a main circuit board 210, an intermediate dielectric board 220, an intermediate circuit board 230, a plurality of intermediate conductive elements 240, a probe base 250, a bottom cover 260, a main stiffener 270, and a plurality of test probes 280.

The main circuit board 210 may be connected to an external testing machine (not shown). The main circuit board 210 comprises two opposing surfaces 212, 214 and a plurality of pads 216 (shown in FIG. 3D). The pads 216 are disposed on the surface 214. The main stiffener 270 is disposed on the surface 212 of the main circuit board 210 and fixed to the main circuit board 210 by a plurality of fixing elements 282, such as bolts.

The intermediate dielectric board 220 comprises a plurality of through holes 222. The intermediate conductive elements 240 are detachably disposed at the through holes 222 of the intermediate dielectric board 220, respectively. In this embodiment, each of the intermediate conductive elements 240 is a pogo pin, for example, and is disposed at one of the through holes 222 in a tight-fit manner.

The intermediate circuit board 230 comprises a plurality of pads 232, a plurality of pads 234, and two opposite surfaces 236, 238. The pads 232 are disposed on the surface 236. The pads 234 are disposed on the surface 238. The surface 236 of the intermediate circuit board 230 faces the intermediate dielectric board 220. The surface 238 of the intermediate circuit board 230 faces the bottom cover 260. In this embodiment, the intermediate dielectric board 220 and the intermediate circuit board 230 are fixed to the bottom cover 260 by means of a plurality of fixing elements 284, such as bolts, such that the intermediate dielectric board 220 and the intermediate circuit board 230 are detachably disposed at the bottom cover 260, and the intermediate circuit board 230 is detachably disposed between the intermediate dielectric board 220 and the bottom cover 260.

The bottom cover 260 is detachably fixed to a surface 214 of the main circuit board 210 by means of a plurality of fixing elements 286, such as bolts; hence, the intermediate dielectric board 220, the intermediate circuit board 230 and the bottom cover 260 are detachably disposed on the surface 214 of the main circuit board 210, and the intermediate dielectric board 220 is disposed between the intermediate circuit board 230 and the main circuit board 210. Furthermore, given the aforesaid arrangement, each of the intermediate conductive elements 240 is electrically connected to one of the pads 216 of the main circuit board 210 and one of the pads 232 of the intermediate circuit board 230.

Figure 4:
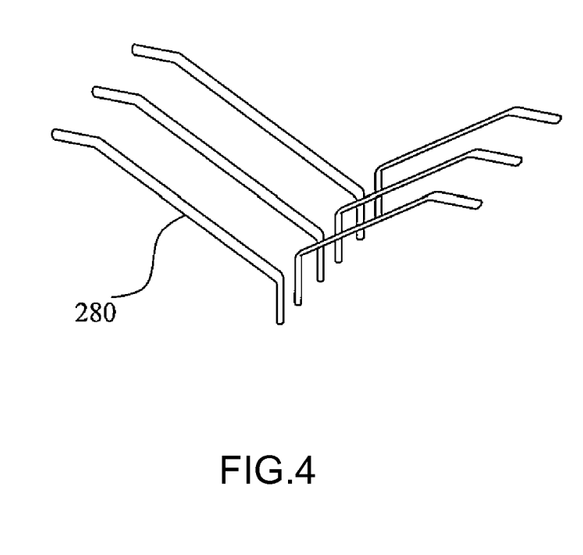
FIG. 4 is a schematic enlarged perspective view of the test probes of FIG. 2.

FIG. 4 is a schematic enlarged perspective view of the test probes of FIG. 2. Referring to FIG. 3D and FIG. 4, in this embodiment, the number of the test probes 280 is six, for example. Each of the test probes 280 may be a cantilever probe, but the present invention is not limited thereto. The test probes 280 are fixed to the probe base 250 by means of a fixing element 252 (such as a resin) and thus supported by the probe base 250. It should be noted that if each of the test probes 280 is a vertical test probe and the structural strength thereof is sufficient, the probe base 250 can be omitted.

Referring to FIG. 2, FIG. 3C and FIG. 3D, the probe base 250 is disposed on the surface 238 of the intermediate circuit board 230 and corresponding in position to a through opening 262 of the bottom cover 260 such that the test probes 280 are corresponding in position to the through opening 262. Given the aforesaid arrangement, the test probes 280 are disposed on the surface 238 of the intermediate circuit board 230 and electrically connected to the pads 234 of the intermediate circuit board 230, respectively. In this embodiment, one end of each of the test probes 280 is connected to one of the pads 234 of the intermediate circuit board 230 by means of soldering. To sum up, each of the test probes 280 is electrically connected to the main circuit board 210 through the intermediate circuit board 230 and one of the intermediate conductive elements 240. Furthermore, another end of each of the test probes 280 is adapted to electrically contact a semiconductor device in order to test the semiconductor device. Specifically speaking, the main circuit board 210 receives test signals from the testing machine. The test signals are transmitted through the test probes 280 such that an electrical test is performed on the semiconductor device.

In this embodiment, the test assembly 200 comprises the main circuit board 210 and the intermediate circuit board 230, and the intermediate conductive elements 240 and the intermediate circuit board 230 can serve the medium of electrical connection between the main circuit board 210 and the test probes 240, so compared to the prior art, the circuit design of the main circuit board 210 can be simplified such that the volume of the main circuit board 210 can be reduced. Therefore, in this embodiment, the required space occupied by the main circuit board 210 of the test assembly 200 can decrease. Furthermore, if the circuit of the main circuit board 210 is defective and thus the main circuit board 210 must be replaced, the cost of replacing the main circuit board 210 having the simple circuit is relatively low.

In this embodiment, the intermediate dielectric board 220, the intermediate conductive elements 240, the intermediate circuit board 230, the bottom cover 260, the probe base 250 and the test probes 280 can be put together to form a sub-assembly in advance. Then, the sub-assembly and the main stiffener 270 are respectively mounted on the two opposite surfaces 214, 212 of the main circuit board to form the test assembly 200 of this embodiment. Because each of the intermediate conductive elements 240 can be a pogo pin and the sub-assembly formed from the intermediate dielectric board 220, the intermediate conductive elements 240, the intermediate circuit board 230, the bottom cover 260, the probe base 250 and the test probes 280 in advance is detachably disposed on the main circuit board 210, the detachment of the sub-assembly from the main circuit board 210 is easy whenever the main circuit board 210 of which the circuit is defective must be replaced.

The test assembly of the aforementioned embodiment of the present invention has one of the following advantages or another advantage. The test assembly of the embodiment of the present invention comprises the main circuit board and the intermediate circuit board, and the intermediate conductive elements and the intermediate circuit board can serve the medium of electrical connection between the main circuit board and the test probes, so compared to the prior art, the circuit design of the main circuit board can be simplified such that the volume of the main circuit board can be reduced. Therefore, the required space occupied by the main circuit board of the test assembly of the embodiment of the present invention can decrease. Furthermore, if the circuit of the main circuit board is defective and thus the main circuit board must be replaced, the cost of replacing the main circuit board having the simple circuit is relatively low.

Because each of the intermediate conductive elements can be a pogo pin and the sub-assembly formed from the intermediate dielectric board, the intermediate conductive elements, the intermediate circuit board, the bottom cover and the test probes in advance is detachably disposed on the main circuit board, the detachment of the sub-assembly from the main circuit board is easy whenever the main circuit board of which the circuit is defective must be replaced.

The foregoing detailed description of the embodiments is used to further clearly describe the features and spirit of the present invention. The foregoing description for each embodiment is not intended to limit the scope of the present invention. All kinds of modifications made to the foregoing embodiments and equivalent arrangements should fall within the protected scope of the present invention. Hence, the scope of the present invention should be explained most widely according to the claims described thereafter in connection with the detailed description, and should cover all the possibly equivalent variations and equivalent arrangements.

What is claimed is:

1. A test assembly, adapted to test a semiconductor device, comprising:
    a main circuit board comprising a surface and a plurality of pads disposed on the surface;
    an intermediate dielectric board detachably disposed on the surface of the main circuit board and comprising a plurality of through holes;
    an intermediate circuit board disposed on the intermediate dielectric board and comprising a plurality of first pads, a plurality of second pads, a first surface and a second surface opposite to the first surface, wherein the intermediate dielectric board is disposed between the intermediate circuit board and the main circuit board, the first pads are disposed on the first surface, the second pads are disposed on the second surface, and the first surface faces the intermediate dielectric board;
    a plurality of intermediate conductive elements disposed at the through holes, respectively, wherein each of the intermediate conductive elements electrically connects one of the pads of the main circuit board and one of the first pads of the intermediate circuit board; and
    a plurality of test probes disposed on the second surface of the intermediate circuit board and electrically connected to the second pads of the intermediate circuit board, respectively, wherein each of the test probes is electrically connected to the main circuit board through the intermediate circuit board and one of the intermediate conductive elements; and
    a bottom cover, a plurality of first fixing elements and a plurality of second fixing elements, wherein the bottom cover comprises a through opening, the intermediate circuit board and the intermediate dielectric board are detachably fixed to the bottom cover by means of the first fixing elements, the bottom cover is detachably fixed to the main circuit board by means of the second fixing elements, and the test probes are corresponding to the through opening;
    wherein the intermediate dielectric board, the intermediate conductive elements, the intermediate circuit board, the bottom cover and the test probes are put together to form a sub-assembly in advance, and the sub-assembly is detachably disposed on the main circuit board, and
    wherein each of the first fixing elements passes through the intermediate dielectric board and the intermediate circuit board to be fixed to the bottom cover.

2. The test assembly of claim 1, wherein the intermediate circuit board is detachably disposed on the intermediate dielectric board.

3. The test assembly of claim 1, wherein the intermediate conductive elements are detachably disposed at the through holes, respectively.

4. The test assembly of claim 1, further comprising a probe base disposed on the second surface of the intermediate circuit board and corresponding to the through opening, wherein the test probes are supported by the probe base.

5. The test assembly of claim 1, wherein each of the intermediate conductive elements is a pogo pin.

6. The test assembly of claim 1, wherein each of the test probes is a cantilever probe.

7. The test assembly of claim 1, further comprising a main stiffener disposed on another surface of the main circuit board opposite to the surface.

8. The test assembly of claim 1, wherein each of the second fixing elements passes through the bottom cover to be fixed to the main circuit board.

9. The test assembly of claim 8, wherein each of the second fixing elements further passes through the intermediate circuit board and the intermediate dielectric board.

10. The test assembly of claim 1, wherein the test probes are disposed at the through opening.

11. A test assembly, adapted to test a semiconductor device, comprising:
a main circuit board comprising a surface and a plurality of pads disposed on the surface;
an intermediate dielectric board detachably disposed on the surface of the main circuit board and comprising a plurality of through holes;
an intermediate circuit board disposed on the intermediate dielectric board and comprising a plurality of first pads, a plurality of second pads, a first surface and a second surface opposite to the first surface, wherein the intermediate dielectric board is disposed between the intermediate circuit board and the main circuit board, the first pads are disposed on the first surface, the second pads are disposed on the second surface, and the first surface faces the intermediate dielectric board;
a plurality of intermediate conductive elements disposed at the through holes, respectively, wherein each of the intermediate conductive elements electrically connects one of the pads of the main circuit board and one of the first pads of the intermediate circuit board;
a plurality of test probes disposed on the second surface of the intermediate circuit board and electrically connected to the second pads of the intermediate circuit board, respectively, wherein each of the test probes is electrically connected to the main circuit board through the intermediate circuit board and one of the intermediate conductive elements; and
a bottom cover, a plurality of first fixing elements and a plurality of second fixing elements, wherein the bottom cover comprises a through opening, the intermediate circuit board and the intermediate dielectric board are detachably fixed to the bottom cover by means of the first fixing elements, the bottom cover is detachably fixed to the main circuit board by means of the second fixing elements, and the test probes are corresponding to the through opening;
wherein the intermediate dielectric board, the intermediate conductive elements, the intermediate circuit board, the bottom cover and the test probes are put together to form a sub-assembly in advance, and the sub-assembly is detachably disposed on the main circuit board, and
wherein each of the second fixing elements passes through the bottom cover to be fixed to the main circuit board;
wherein each of the second fixing elements further passes through the intermediate circuit board and the intermediate dielectric board.

12. The test assembly of claim 11, wherein the intermediate circuit board is detachably disposed on the intermediate dielectric board.

13. The test assembly of claim 11, wherein the intermediate conductive elements are detachably disposed at the through holes, respectively.

14. The test assembly of claim 11, further comprising a probe base disposed on the second surface of the intermediate circuit board and corresponding to the through opening, wherein the test probes are supported by the probe base.

15. The test assembly of claim 11, wherein each of the intermediate conductive elements is a pogo pin.

16. The test assembly of claim 11, wherein each of the test probes is a cantilever probe.

17. The test assembly of claim 11, further comprising a main stiffener disposed on another surface of the main circuit board opposite to the surface.

18. The test assembly of claim 11, wherein the test probes are disposed at the through opening.

* * * * *